US010236827B2

(12) United States Patent
Zhu et al.

(10) Patent No.: US 10,236,827 B2
(45) Date of Patent: Mar. 19, 2019

(54) OFFSET CALIBRATION FOR AMPLIFIER AND PRECEDING CIRCUIT

(71) Applicant: Cirrus Logic International Semiconductor Ltd., Edinburgh (GB)

(72) Inventors: Lei Zhu, Austin, TX (US); Ku He, Austin, TX (US); Xin Zhao, Austin, TX (US); Miao Song, Austin, TX (US); Saurabh Singh, Cedar Park, TX (US); Vinod Jayakumar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/622,722

(22) Filed: Jun. 14, 2017

(65) Prior Publication Data

US 2018/0212569 A1 Jul. 26, 2018

Related U.S. Application Data

(60) Provisional application No. 62/448,490, filed on Jan. 20, 2017.

(51) Int. Cl.
*H03F 1/02* (2006.01)
*H03F 3/183* (2006.01)
(Continued)

(52) U.S. Cl.
CPC ............. *H03F 1/0205* (2013.01); *H03F 1/30* (2013.01); *H03F 1/3264* (2013.01); *H03F 3/183* (2013.01);
(Continued)

(58) Field of Classification Search
CPC ....... H03F 3/005; H03F 1/02; H03F 2200/231
(Continued)

(56) References Cited

U.S. PATENT DOCUMENTS 5,652,542 A   7/1997   Fink
6,316,992 B1  11/2001  Miao et al.
(Continued)

FOREIGN PATENT DOCUMENTS

GB   2527677 A       12/2015
WO   2011064787 A1   6/2011
WO   2016003597 A2   1/2016

OTHER PUBLICATIONS

Search and Examination Report under Sections 17 and 18(3), U.K. Intellectual Property Office, Application No. GB1704803.4, dated Aug. 25, 2017.

(Continued)

*Primary Examiner* — Steven J Mottola
(74) *Attorney, Agent, or Firm* — Jackson Walker L.L.P.

(57) ABSTRACT

A method may include, in an apparatus comprising a closed loop amplifier and a signal processing block configured to generate an amplifier input signal as a function of an upstream signal received at an input of the signal processing block, in a calibration mode of the apparatus: decoupling a second stage input of the amplifier from a first stage output of the amplifier; determining an offset signal that when applied to the input of a signal processing block as the upstream signal generates approximately zero as an intermediate signal generated by the first stage of the amplifier; and controlling one or more parameters of the apparatus based on the offset signal to compensate for an offset of at least one of the first stage and the signal processing block.

18 Claims, 3 Drawing Sheets

(51) Int. Cl.
  *H03F 3/21*   (2006.01)
  *H03F 3/217*  (2006.01)
  *H03F 1/30*   (2006.01)
  *H03F 1/32*   (2006.01)
  *H03F 3/187*  (2006.01)

(52) U.S. Cl.
  CPC .............. *H03F 3/187* (2013.01); *H03F 3/21* (2013.01); *H03F 3/217* (2013.01); *H03F 3/2171* (2013.01); *H03F 2200/03* (2013.01); *H03F 2200/375* (2013.01)

(58) Field of Classification Search
  USPC .......................................................... 330/2, 9
  See application file for complete search history.

(56) References Cited

U.S. PATENT DOCUMENTS

| | | | |
|---|---|---|---|
| 6,603,356 B1 * | 8/2003 | Kim | .................. H03F 1/308 330/2 |
| 6,724,248 B2 | 4/2004 | Llewellyn | |
| 7,812,665 B2 | 10/2010 | Eschauzier et al. | |
| 2007/0194845 A1 | 8/2007 | Kost et al. | |
| 2008/0018393 A1 | 1/2008 | Tanaka et al. | |
| 2008/0094135 A1 | 4/2008 | Mazda et al. | |
| 2008/0130186 A1 | 6/2008 | Nagase et al. | |
| 2011/0080217 A1 | 4/2011 | Lee et al. | |
| 2013/0120063 A1 | 5/2013 | Lesso | |
| 2013/0127531 A1 | 5/2013 | Lesso | |
| 2013/0223652 A1 | 8/2013 | Sahandiesfanjani et al. | |
| 2016/0072465 A1 | 3/2016 | Das et al. | |
| 2017/0077882 A1 | 3/2017 | Wang et al. | |
| 2018/0212570 A1 | 7/2018 | Zhu et al. | |

OTHER PUBLICATIONS

International Search Report and Written Opinion of the International Searching Authority, International Application No. PCT/US2018/014326, dated Apr. 5, 2018.

Combined Search and Examination Report of the UKIPO, Application No. GB1712743.2, dated Feb. 8, 2018.

* cited by examiner

OFFSET CALIBRATION FOR AMPLIFIER AND PRECEDING CIRCUIT

RELATED APPLICATION

The present disclosure claims priority to U.S. Provisional Patent Application Ser. No. 62/448,490, filed Jan. 20, 2017, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to calibrating offset for an amplifier and a circuit preceding the amplifier in a signal path.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, an analog signal to be amplified may be converted to a series of pulses by pulse-width modulation, pulse-density modulation, or another method of modulation, such that the analog signal is converted into a modulated signal in which a characteristic of the pulses of the modulated signal (e.g., pulse widths, pulse density, etc.) is a function of the magnitude of the analog signal. After amplification with a class-D amplifier, the output pulse train may be converted back to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

In a class-D amplifier, signal offset may be present due to a circuit (e.g., a digital-to-analog converter) preceding the amplifier, an input stage of the amplifier, and input impedances and feedback resistances that add offset due to varying common mode voltages. Other types of amplifiers may experience offset due to one or more of the same reasons. For high performance of a circuit comprising an amplifier, it may be desirable to calibrate and correct for such sources of offset.

SUMMARY

In accordance with the teachings of the present disclosure, one or more disadvantages and problems associated with existing approaches to offset calibration associated with an amplifier may be reduced or eliminated.

In accordance with embodiments of the present disclosure, an apparatus may include a closed loop amplifier, a signal processing block, and a calibration subsystem. The closed loop amplifier may include a first stage configured to receive an amplifier input signal at an amplifier input and generate at a first stage output an intermediate signal which is a function of the amplifier input signal, a second stage configured to receive the intermediate signal at a second stage input and configured to generate at a second stage output an output signal from the intermediate signal which is a function of the amplifier input signal, and an input network and a feedback network configured to set a gain of the closed loop amplifier. The signal processing block may be configured to generate the amplifier input signal as a function of an upstream signal received at an input of the signal processing block. The calibration subsystem may be configured to, in a calibration mode, decouple the second stage input from the first stage output, determine an offset signal that when applied to the input of the signal processing block as the upstream signal generates approximately zero as the intermediate signal, and control one or more parameters of the apparatus based on the offset signal to compensate for an offset of at least one of the first stage and the signal processing block.

In accordance with these and other embodiments of the present disclosure, a method may include, in an apparatus comprising a closed loop amplifier having a first stage configured to receive an amplifier input signal at an amplifier input and generate at a first stage output an intermediate signal which is a function of the amplifier input signal, a second stage configured to receive the intermediate signal at a second stage input and configured to generate at a second stage output an output signal from the intermediate signal which is a function of the amplifier input signal, and an input network and a feedback network configured to set a gain of the closed loop amplifier, and the apparatus also having a signal processing block configured to generate the amplifier input signal as a function of an upstream signal received at an input of the signal processing block, in a calibration mode of the apparatus: decoupling the second stage input from the first stage output; determining an offset signal that when applied to the input of the signal processing block as the upstream signal generates approximately zero as the intermediate signal; and controlling one or more parameters of the apparatus based on the offset signal to compensate for an offset of at least one of the first stage and the signal processing block.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
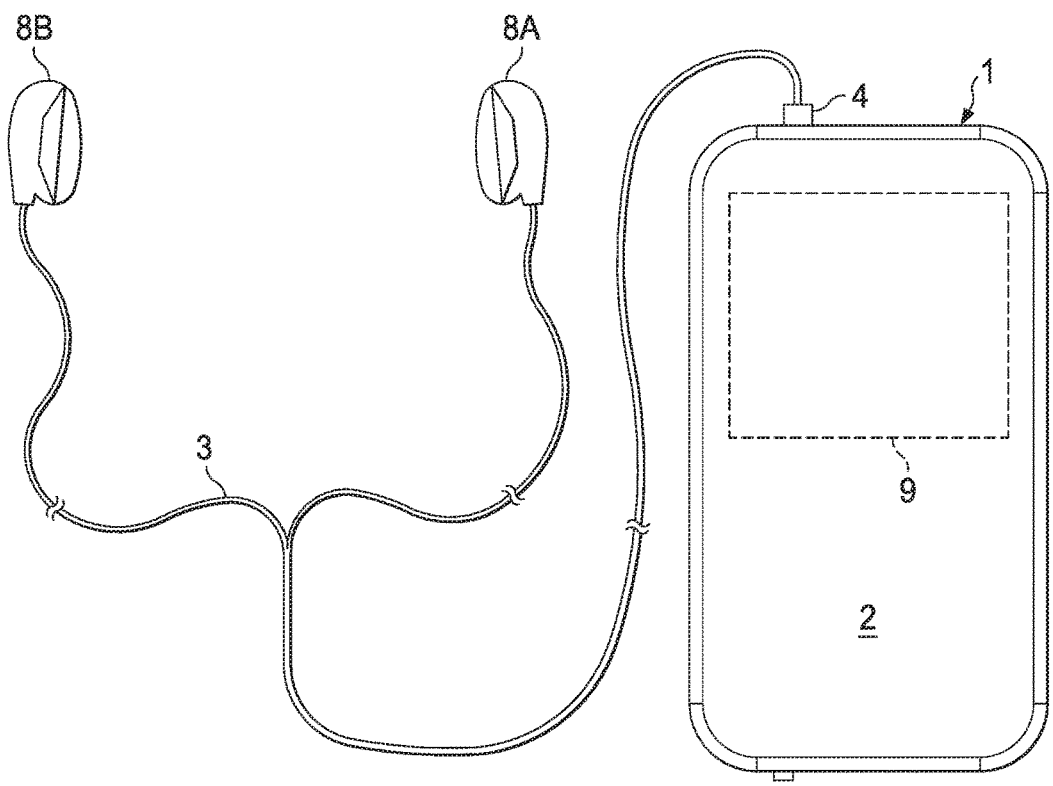
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
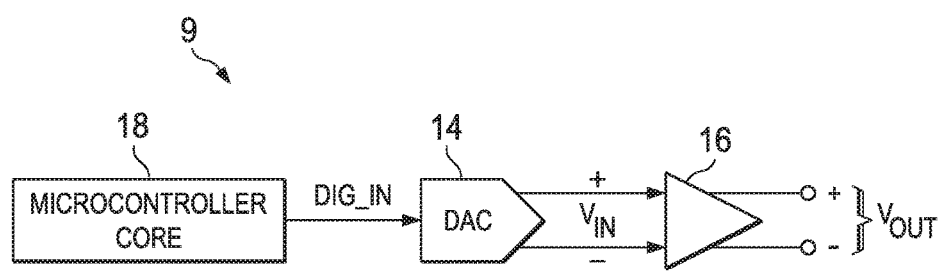
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
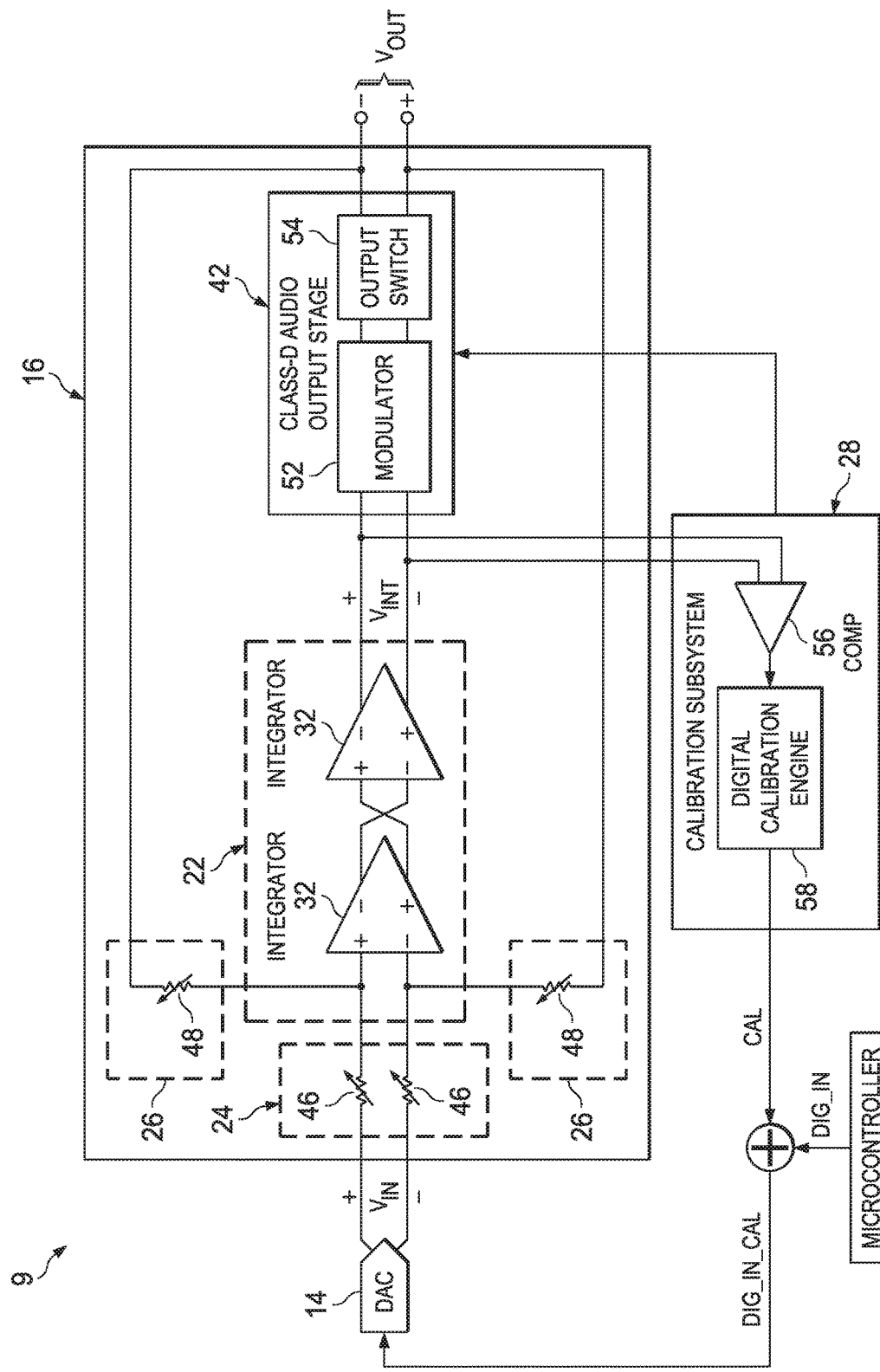
FIG. 3 is a block diagram of selected components of the example audio integrated circuit shown in FIG. 2 with a calibration circuit and additional detail regarding an amplifier of the audio integrated circuit, in accordance with embodiments of the present disclosure.

FIG. 3 is a block diagram of selected components of example audio IC 9 shown in FIG. 2 with a calibration subsystem 28 and additional detail regarding amplifier 16, in accordance with embodiments of the present disclosure. As shown in FIG. 3, amplifier 16 may include a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a final output stage comprising a class-D audio output stage 42 configured to generate audio output signal $V_{OUT}$ at an amplifier output of amplifier 16 as a function of intermediate signal $V_{INT}$, an input network 24 at the amplifier input, and a signal feedback network 26 coupled between the amplifier output and the amplifier input. Also as depicted in FIG. 3, audio IC 9 may include calibration subsystem 28 for calibration of offset in the audio signal path of audio IC 9, as described in greater detail below.

First stage 22 may include any suitable analog front end circuit for conditioning analog input signal $V_{IN}$ for use by class-D audio output stage 42. For example, first stage 22 may include one or more analog integrators 32 cascaded in series, as shown in FIG. 3.

Class-D audio output stage 42 may include any suitable driving circuit for driving audio output signal $V_{OUT}$ as a function of intermediate signal $V_{INT}$ (thus, also making audio output signal $V_{OUT}$ a function of analog input signal $V_{IN}$). For example, class-D audio output stage 42 may comprise any suitable system, device, or apparatus configured to amplify intermediate signal $V_{INT}$ and convert intermediate signal $V_{INT}$ into a series of pulses by pulse-width modulation, pulse-density modulation, or another method of modulation, such that intermediate signal $V_{INT}$ is converted into a modulated signal in which a characteristic of the pulses of the modulated signal (e.g., pulse widths, pulse density, etc.) is a function of the magnitude of intermediate signal $V_{INT}$. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven class-D audio output stage 42. As shown in FIG. 3, class-D audio output stage 42 may include a control input for receiving a control input from calibration subsystem 28 in order to selectively enable class-D audio output stage 42 during an operational mode of audio IC 9 and disable class-D audio output stage 42 during a calibration mode of audio IC 9 (e.g., powering down or otherwise preventing class-D audio output stage 42 from driving the amplifier output of amplifier 16 by disabling or decoupling a supply voltage from class-D audio output stage 42 or by disabling or decoupling driving devices of the amplifier output of amplifier 16). As shown in FIG. 3, class-D audio output stage 42 may include a modulator 52 having a modulator input for receiving intermediate signal $V_{INT}$ and configured to generate at a modulator output a modulated signal from intermediate signal $V_{INT}$ and also having an output switch block 54 comprising a plurality of output switches configured to generate audio output signal $V_{OUT}$ from the modulated signal when the first mode is enabled.

Input network 24 may include any suitable input network for receiving an input signal (e.g., $V_{IN}$) at the amplifier input of amplifier 16. For example, as shown in FIG. 3, input network 24 may include variable input resistors 46. In addition, signal feedback network 26 may include any suitable feedback network for feeding back a signal indicative of audio output signal $V_{OUT}$ to the amplifier input of amplifier 16. For example, as shown in FIG. 3, signal feedback network 26 may include variable feedback resistors 48. In operation, resistances of input resistors 46 and variable feedback resistors 48 may be controlled by control signals received from a suitable gain control circuit in order to set a signal gain for amplifier 16.

Thus, in accordance with the above, amplifier 16 may comprise a closed loop amplifier having a first stage (e.g., first stage 26) configured to receive an amplifier input signal (e.g., $V_{IN}$) at an amplifier input and generate at a first stage output an intermediate signal (e.g., $V_{INT}$) which is a function of the amplifier input signal, a second stage (e.g., class-D audio output stage 42) configured to receive the intermediate signal at a second stage input and configured to generate at a second stage output an output signal (e.g., $V_{OUT}$) from the intermediate signal which is a function of the amplifier input signal, and an input network (e.g., input network 24) and a feedback network (e.g., feedback network 26) configured to set a gain of the closed loop amplifier.

Calibration subsystem 28 may include any suitable system, device, or apparatus configured to, in a calibration mode of audio IC 9, decouple an input of a second stage of an amplifier (e.g., input of class-D audio output stage 42), an output of a first stage of the amplifier (e.g., output of first stage 22), determine an offset signal (e.g., calibration signal CAL shown in FIG. 3) that when applied to the input of a signal processing block (e.g., DAC 14) generates approximately zero as an intermediate signal (e.g., $V_{INT}$) at the output of the first stage, and controls one or more parameters of an apparatus (e.g., audio IC 9) based on the offset signal to compensate for an offset of at least one of the first stage (e.g., first stage 22) and the signal processing block (e.g., DAC 14).

In addition, calibration subsystem 28 may, in the calibration mode, further determine the offset signal (e.g., calibration signal CAL shown in FIG. 3) at two different signal gains of the amplifier (e.g., as set by resistances of input resistors 46 and variable feedback resistors 48) to extrapolate an offset of the first stage (e.g., first stage 22) and an offset of the signal processing block (e.g., DAC 14) and control one or more parameters of the apparatus (e.g., audio IC 9) based on the offset of the first stage to compensate for the offset of the first stage and based on the offset of the signal processing block to compensate for the offset of the signal processing block.

Furthermore, calibration subsystem 28 may be further configured to, in the calibration mode, electrically short the second stage output (e.g., input of class-D audio output stage 42) prior to determining the offset signal (e.g., calibration signal CAL shown in FIG. 3).

Moreover, calibration subsystem 28 may be further configured to, in the calibration mode, electrically short the second stage output (e.g., input of class-D audio output stage 42), overdrive a common mode voltage of the second stage output, determine a second offset signal (e.g., another determination of calibration signal CAL shown in FIG. 3) that when applied to the input of the signal processing block (e.g., DAC 14) generates approximately zero as the intermediate signal (e.g., $V_{INT}$), and control one or more parameters of the apparatus (e.g., audio IC 9) based on the second offset signal to compensate for an offset of an input network (e.g., input network 24) and a feedback network (e.g., feedback network 26).

As shown in FIG. 3, calibration subsystem 28 may include a comparator 56 and a digital calibration engine 58. Comparator 56 may comprise an auto-zero comparator that receives intermediate voltage $V_{INT}$ and outputs a signal indicative of a comparison of the terminals of intermediate voltage $V_{INT}$ to digital calibration engine 58. Digital calibration engine 58 may, based on the output of comparator 56, generate a digital calibration signal CAL that may be combined with digital input signal DIG_IN to generate a calibrated digital input signal DIG_IN_CAL received by DAC 14. More detailed operation of calibration subsystem 28 is set forth below with respect to FIG. 4.

Figure 4:
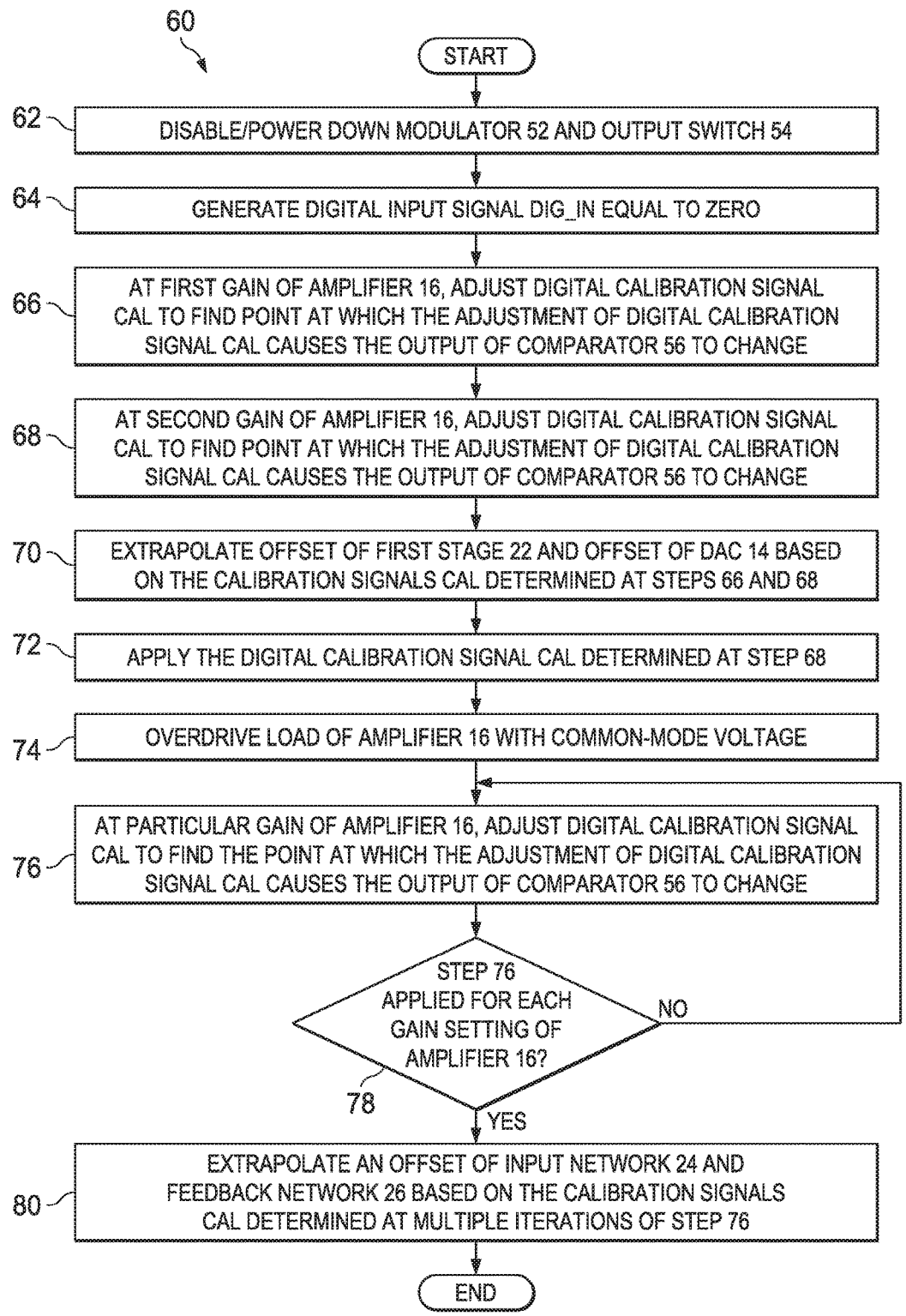
FIG. 4 is a flow chart of an example method for offset calibration in a circuit comprising an amplifier, in accordance with embodiments of the present disclosure.

FIG. 4 is a flow chart of an example method 60 for offset calibration in a circuit (e.g., audio IC 9) comprising an amplifier (e.g., amplifier 16), in accordance with embodiments of the present disclosure. According to some embodiments, method 60 may begin at step 62. As noted above, teachings of the present disclosure are implemented in a variety of configurations of personal audio device 1. As such, the preferred initialization point for method 60 and the order of the steps comprising method 60 may depend on the implementation chosen.

At step 62, calibration subsystem 28 may disable (e.g., power down) modulator 52 and output switch 54 of class-D audio output stage 42 and electrically short the output terminals of class-D audio output stage together (e.g., such that output voltage $V_{OUT}$=0). At step 64, microcontroller core 18 may generate digital input signal DIG_IN equal to zero. At step 66, calibration subsystem 28 may, at a first gain of amplifier 16, adjust digital calibration signal CAL to find the point at which the adjustment of digital calibration signal CAL causes the output of comparator 56 to change (e.g., thus indicating a change in polarity of intermediate signal $V_{INT}$). At step 68, calibration subsystem 28 may, at a second gain of amplifier 16, adjust digital calibration signal CAL to find the point at which the adjustment of digital calibration signal CAL causes the output of comparator 56 to change (e.g., thus indicating a change in polarity of intermediate signal $V_{INT}$). At step 70, calibration subsystem 28 may extrapolate an offset of first stage 22 and an offset of DAC 14 based on the calibration signals CAL determined at steps 66 and 68.

At step 72, calibration system 28 may apply the digital calibration signal CAL determined at step 68. At step 74, calibration subsystem 28 may cause a load at the output of amplifier 16 to be overdriven with a common-mode voltage. At step 76, calibration subsystem 28 may, at a particular gain of amplifier 16, adjust digital calibration signal CAL to find the point at which the adjustment of digital calibration signal CAL causes the output of comparator 56 to change (e.g., thus indicating a change in polarity of intermediate signal $V_{INT}$). At step 78, calibration subsystem 28 may determine if step 76 has been applied for each gain setting of amplifier 16. If step 76 has not been applied for each gain setting of amplifier 16, method 60 may proceed again to step 76. Otherwise, if step 76 has been applied for each gain setting of amplifier 16, method 60 may proceed to step 80. At step 80, calibration subsystem 28 may extrapolate an offset of input network 24 and feedback network 26 based on the calibration signals CAL determined at multiple iterations of step 76. After completion of step 80, method 60 may end.

Although FIG. 4 discloses a particular number of steps to be taken with respect to method 60, method 60 may be executed with greater or fewer steps than those depicted in FIG. 4. In addition, although FIG. 4 discloses a certain order of steps to be taken with respect to method 60, the steps comprising method 60 may be completed in any suitable order.

Method 60 may be implemented using personal audio device 1 or any other system operable to implement method 60. In certain embodiments, method 60 may be implemented partially or fully in software and/or firmware embodied in computer-readable media and executable by a controller.

Although the foregoing discussion contemplates embodiments in which amplifier 16 is a class-D amplifier having class-D audio output stage 42, the foregoing systems and methods may be applied to amplifiers other than class-D amplifiers having second stages other than a class-D audio output stage. For example, in some embodiments, amplifier 16 may include a class-AB audio output stage in lieu of class-D audio output stage 42. In such class-AB embodiments, first stage 22 may be used as a comparator along with calibration subsystem 28 in order to extract an offset for amplifier 16 and an offset for DAC 14.

In addition, although the foregoing discussion contemplates embodiments in which first stage 22 comprises one or more integrators 32, in some embodiments, first stage 22 may comprise an open-loop amplifier in lieu of integrators 32.

Moreover, although the foregoing discussion contemplates embodiments in which DAC 14 is interfaced between microcontroller core 18 and amplifier 16, in some embodiments, another signal processing system in addition to or in lieu of DAC 14 may be interfaced between microcontroller core 18 and amplifier 16.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus comprising:
   a closed loop amplifier comprising:
   a first stage configured to receive an amplifier input signal at an amplifier input and generate, at a first stage output, an intermediate signal which is a function of the amplifier input signal, the first stage including at least one integrator;
   a second stage configured to receive the intermediate signal at a second stage input and configured to generate, at a second stage output, an output signal from the intermediate signal, the output signal being a function of the amplifier input signal; and
   an input network and a feedback network configured to set a gain of the closed loop amplifier;
   a signal processing block comprising a digital-to-analog converter, the signal processing block being configured to generate the amplifier input signal as a function of an upstream signal received at an input of the signal processing block; and
   a calibration subsystem configured to, in a calibration mode:
   disable the second stage;
   determine an offset signal that when applied to the input of the signal processing block as the upstream signal generates approximately zero as the intermediate signal; and
   control one or more parameters of the apparatus based on the offset signal to compensate for an offset of at least one of the first stage and the signal processing block.

2. The apparatus of claim 1, wherein the second stage comprises a Class D output stage.

3. The apparatus of claim 1, wherein the second stage comprises a Class AB output stage.

4. The apparatus of claim 1, wherein the calibration subsystem is further configured to, in the calibration mode:
   determine the offset signal at two different signal gains of the closed loop amplifier to extrapolate an offset of the first stage and an offset of the signal processing block; and
   control one or more parameters of the apparatus based on the offset of the first stage to compensate for the offset of the first stage and based on the offset of the signal processing block to compensate for the offset of the signal processing block.

5. The apparatus of claim 1, wherein the calibration subsystem is further configured to, in the calibration mode, electrically short the second stage output prior to determining the offset signal.

6. The apparatus of claim 1, wherein the calibration subsystem is further configured to, in the calibration mode, after determining the offset signal of the first stage and the signal processing block:
   electrically short the second stage output;
   overdrive a common mode voltage of the second stage output;
   determine a second offset signal that when applied to the input of the signal processing block as the upstream signal generates approximately zero as the intermediate signal; and
   control one or more parameters of the apparatus based on the second offset signal to compensate for an offset of the input network and the feedback network.

7. A method comprising, in a calibration mode of an apparatus that includes a closed loop amplifier having a first stage that comprises an integrator and is configured to receive an amplifier input signal at an amplifier input and generate at a first stage output an intermediate signal which is a function of the amplifier input signal, a second stage configured to receive the intermediate signal at a second stage input and configured to generate at a second stage output an output signal from the intermediate signal which is a function of the amplifier input signal, and an input network and a feedback network configured to set a gain of the closed loop amplifier, the closed loop amplifier also having a signal processing block configured to generate the amplifier input signal as a function of an upstream signal received at an input of the signal processing block:
   disabling the second stage;
   determining an offset signal that when applied to the input of the signal processing block as the upstream signal generates approximately zero as the intermediate signal, wherein the offset signal is determined at two different signal gains of the closed loop amplifier to extrapolate an offset of the first stage and an offset of the signal processing block; and
   controlling one or more parameters of the apparatus based on the offset of the first stage to compensate for the offset of the first stage and based on the offset of the signal processing block to compensate for the offset of the signal processing block.

8. The method of claim 7, wherein the second stage comprises a Class D output stage.

9. The method of claim 7, wherein the second stage comprises a Class AB output stage.

10. The method of claim 7, further comprising, in the calibration mode, electrically shorting the second stage output prior to determining the offset signal.

11. The method of claim 7, further comprising, in the calibration mode, after determining the offset signal of the first stage and the signal processing block:
electrically shorting the second stage output;
overdriving a common mode voltage of the second stage output;
determining a second offset signal that when applied to the input of the signal processing block as the upstream signal generates approximately zero as the intermediate signal; and
controlling one or more parameters of the apparatus based on the second offset signal to compensate for an offset of the input network and the feedback network.

12. The method of claim 7, wherein the signal processing block comprises a digital-to-analog converter.

13. An apparatus comprising:
a closed loop amplifier comprising:
a first stage configured to receive an amplifier input signal at an amplifier input and generate, at a first stage output, an intermediate signal which is a function of the amplifier input signal;
a second stage configured to receive the intermediate signal at a second stage input and configured to generate, at a second stage output, an output signal from the intermediate signal, the output signal being a function of the amplifier input signal; and
an input network and a feedback network configured to set a gain of the closed loop amplifier;
a signal processing block configured to generate the amplifier input signal as a function of an upstream signal received at an input of the signal processing block; and
a calibration subsystem configured to, in a calibration mode:
disable the second stage;
electrically short the second stage output;
after electrically shorting the second stage output, determine an offset signal that when applied to the input of the signal processing block as the upstream signal generates approximately zero as the intermediate signal; and
control one or more parameters of the apparatus based on the offset signal to compensate for an offset of at least one of the first stage and the signal processing block.

14. The apparatus of claim 13, wherein the second stage comprises a Class D output stage.

15. The apparatus of claim 13, wherein the second stage comprises a Class AB output stage.

16. The apparatus of claim 13, wherein the calibration subsystem is further configured to, in the calibration mode:
determine the offset signal at two different signal gains of the closed loop amplifier to extrapolate an offset of the first stage and an offset of the signal processing block; and
control one or more parameters of the apparatus based on the offset of the first stage to compensate for the offset of the first stage and based on the offset of the signal processing block to compensate for the offset of the signal processing block.

17. The apparatus of claim 13, wherein the calibration subsystem is further configured to, in the calibration mode, after determining the offset signal of the first stage and the signal processing block:
overdrive a common mode voltage of the second stage output;
determine a second offset signal that when applied to the input of the signal processing block as the upstream signal generates approximately zero as the intermediate signal; and
control one or more parameters of the apparatus based on the second offset signal to compensate for an offset of the input network and the feedback network.

18. The apparatus of claim 13, wherein the signal processing block comprises a digital-to-analog converter.

* * * * *